(12) United States Patent
Vartuli et al.

(10) Patent No.: US 6,793,848 B2
(45) Date of Patent: Sep. 21, 2004

(54) TERBIUM OR LUTETIUM CONTAINING GARNET SCINTILLATORS HAVING INCREASED RESISTANCE TO RADIATION DAMAGE

(75) Inventors: James Scott Vartuli, Rexford, NY (US); Steven Jude Ductos, Clifton Park, NY (US); Robert Joseph Lyons, Burnt Hills, NY (US); Charles David Greskovich, Schenectady, NY (US)

(73) Assignee: General Electric Company, Schenectady, NY (US)

( * ) Notice: Subject to any disclaimer, the term of this patent is extended or adjusted under 35 U.S.C. 154(b) by 3 days.

(21) Appl. No.: 10/316,151

(22) Filed: Dec. 10, 2002

(65) Prior Publication Data

US 2003/0127630 A1 Jul. 10, 2003

Related U.S. Application Data

(63) Continuation-in-part of application No. 09/682,737, filed on Oct. 11, 2001, now Pat. No. 6,630,077.

(51) Int. Cl.$^7$ ............................................. C09K 11/08
(52) U.S. Cl. ..................... 252/301.4 R; 250/363.04; 378/19; 378/98.8; 264/21; 117/945
(58) Field of Search ....................... 250/363.04; 378/19, 378/98.8; 252/301.4 R; 264/21; 117/945

(56) References Cited

U.S. PATENT DOCUMENTS

| | | | |
|---|---|---|---|
| 3,974,389 A | 8/1976 | Ferri et al. | |
| 4,405,691 A | 9/1983 | Yale | |
| 4,421,671 A | 12/1983 | Cusano et al. | |
| 4,473,513 A | 9/1984 | Cusano et al. | |
| 4,507,560 A | 3/1985 | Mathers et al. | |
| 4,525,628 A | 6/1985 | DiBianca et al. | |
| 4,783,596 A | 11/1988 | Riedner et al. | |
| 5,096,614 A | 3/1992 | Yale et al. | |
| 6,143,200 A | 11/2000 | Akiwa et al. | |
| 6,630,077 B2 * | 10/2003 | Shiang et al. | .......... 252/301.4 R |

OTHER PUBLICATIONS

Blasse, G. et al., Luminescent Materials, *Springer–Verlag, Berline*, pp. 166–168, 1994.
Chani, V. E. et al., Melt Growth of $(Tb,Lu)_3 Al_5O_{12}$ Mixed Garnet Fiber Crystals, *Journal of Crystal Growth*, 121:469–475, 2000.
Grassman, H., et al., Properties of CsI(Tl)—Renaissance of an Old Scintillation Material, *Nuclear Instruments and Methods in Physics Research*, 228:323–326, 1985.
Ganschow, S. et al., "On the Crystallization of Terbium Aluminum Garnet", *Cryst. Res. Technol.*, 34: 5–8, 615–619, 1999.

* cited by examiner

*Primary Examiner*—C. Melissa Koslow
(74) *Attorney, Agent, or Firm*—Kilpatrick Stockton LLP; Charles W. Calkins; Cynthia B. Rothschild

(57) ABSTRACT

The present invention provides terbium or lutetium garnet x ray scintillators activated with a rare earth metal ion, such as cerium, and treated by annealing in a controlled atmosphere comprising a predetermined amount of oxygen for a predetermined time and temperature to reduce radiation damage that would otherwise occur when the scintillator material is exposed to high energy radiation, such as the type of radiation required to use the scintillator for medical radiographic imaging and the like. In an embodiment, a single crystal or a polycrystalline scintillator comprising the general formula $(Tb_{1-x}Lu_xCe_y)_3Al_5O_{12}$ (where $0<x\leq0.5$, and y is in the range from about 0.0005 to about 0.2, and annealed at 1400° C. to 1500° C. in a controlled atmosphere comprising $1\times10^{-6}$ to 0.22 atm oxygen shows an increased resistance to radiation damage.

78 Claims, 1 Drawing Sheet

Conditions and Sample ID

TERBIUM OR LUTETIUM CONTAINING GARNET SCINTILLATORS HAVING INCREASED RESISTANCE TO RADIATION DAMAGE

CROSS-REFERENCE TO RELATED APPLICATION

This application is a continuation in part of, and therefore claims priority to, U.S. application Ser. No. 09/682,737, filed Oct. 11, 2001, now U.S. Pat. No. 6,630,077. U.S. application Ser. No. 09/682,737 is incorporated by reference herein in its entirety.

BACKGROUND OF THE INVENTION

The present invention relates to terbium or lutetium containing scintillators that are activated with a rare earth metal ion, such as cerium, and treated by annealing at high temperatures in a defined oxygen atmosphere, such that the annealed scintillator has an increased resistance to high-energy radiation damage as compared to a same scintillator not treated by the methods of the present invention.

Solid state scintillator materials have long been used as radiation detectors to detect penetrating radiation in such applications as x ray counters and image intensifiers. The scintillator materials emit visible or near visible radiation when stimulated by x rays or other high energy electromagnetic photons. In typical medical or industrial applications, the optical output from the scintillator is directed to a photoelectrically responsive device to produce electrical output signals, where the amplitude of the signals is proportional to the deposited energy. The electrical signals can than be digitized by a computer for display on a screen or other permanent medium. Such detectors play an important role in computerized tomography (CT) scanners, digital radiography (DR), and other x ray, gamma radiation, ultraviolet radiation, and nuclear radiation detecting applications. In medical applications, it is especially desirable that the scintillator efficiently absorb nearly all the x rays that pass through a patient, so that the detector utilizes a maximal amount of the high energy administered, and the patient is not subject to a higher radiation dose than necessary.

Among the preferred scintillator compositions in the present generation of CT scanners are ceramic scintillators that employ at least one of the oxides of lutetium, yttrium, and gadolinium as matrix materials. These are described in detail, for example, in U.S. Pat. Nos. 4,421,671, 4,473,513, 4,525,628, and 4,783,596. These scintillators typically comprise a major proportion of yttria ($Y_2O_3$), up to about 50 mole percent gadolinia ($Gd_2O_3$), and a minor activating proportion (typically about 0.02–12, preferably about 1–6 and most preferably about 3 mole percent) of a rare earth activator oxide. Suitable activator oxides, as described in the aforementioned patents, include the oxides of europium, neodymium, ytterbium, dysprosium, terbium, and praseodymium. Europium-activated scintillators are often preferred in commercial X ray detectors because of their high luminescent efficiency, low afterglow level, and other favorable characteristics.

Still, there is a need to provide improved scintillator materials for the continually evolving medical applications and technologies that employ radiation-based imaging techniques. To meet the requirements of typical medical radiographic applications, the scintillator must be an efficient converter of x ray radiation (or other high-energy radiation) into optical radiation for the regions of the electromagnetic spectrum detected by photodetection means. Also, it is preferred that the scintillator transmit optical radiation efficiently, to avoid trapping of the signal generated within the scintillator body. The scintillator should also be characterized by high x ray stopping power, low hysteresis, spectral linearity, and short afterglow.

One important property of CT systems is scan time, which is the time required for a CT system to scan and acquire an image of a slice of the object under observation. Scan times are related to the primary decay time of the scintillator roughly by a factor of 1000. For example, a scan time of 1 second will typically require a scintillator having a decay time of 1 millisecond or less. Thus, shorter CT scan times require shorter scintillator decay times. The present generation of CT systems have scan times on the order of 1 second, and generally are not lower than about 0.4 second. Still shorter scan times are desired. Decreasing scan time increases the number of patients that can be seen, as well as the number of scans taken in a single measurement, as each measurement requires a patent to "hold their breath" during the measurement period. Shorter scan times also reduce image blurring due to the motion of internal organs or motion that occurs when taking scans of non-cooperating patients, such as small children.

Another important consideration for scintillators is to reduce damage that occurs to the scintillator upon repeated exposure of the scintillator to high energy radiation. Radiographic equipment employing solid state scintillator materials for the conversion of high energy radiation to an optical image may experience changes in efficiency after exposure of the scintillator to high dosages of radiation. For example, radiation damage for bismuth germanate single crystal scintillators may be as high as 11% after a thirty minute exposure to ultraviolet radiation from a mercury lamp. Similar results are reported for higher energy gamma radiation. Furthermore, the variation in radiation damage from crystal to crystal of bismuth germanate scintillators is high, approximating a factor of at least 30. A similar change in efficiency can be found when polycrystalline type ceramic scintillators are exposed to high energy radiation dosages.

Radiation damage in scintillators is characterized by a change in light output and/or a darkening in color of the scintillator body with prolonged exposure to radiation. Radiation damage can lead to "ghost images" from prior scans which thereby reduce image resolution. The change in light output that occurs upon radiation damage is often found to be variable in magnitude from batch-to-batch of the same scintillator, making it difficult to predict how any individual scintillator will change over time and thus, making it difficult to implement quantitative correction measures. For example, yttria-gadolinia ceramic scintillators activated with europium exhibit a reduction in light output of 4 to 33%, depending upon the scintillator batch, for 450 roentgens of 140 kVP x rays. This amount of variation in light output which can occur as a result of x ray damage is undesirable in a quantitative x ray detector.

Thus, there is a need to develop scintillator materials that have short decay time (to minimize scanning time), and that show reduced damage upon repeated exposure to the high energy radiation typically employed in the applications requiring scintillators (to increase the reproducibility of the measurements). There is also a need to develop methods for scintillator preparation that are reproducible, but simple enough to be cost-effective and easily adapted to existing protocols for scintillator manufacture.

SUMMARY OF THE INVENTION

Thus, in one aspect, the present invention comprises a method for preparing a terbium or lutetium containing garnet scintillator having increased resistance to radiation-induced changes in scintillator efficiency comprising annealing a garnet scintillator in a controlled atmosphere comprising a predetermined amount of oxygen for a predetermined time and temperature, such that the annealed scintillator comprises a smaller radiation-induced change in efficiency of signal generation than a same scintillator not treated by said annealing, wherein said garnet scintillator comprises at least one metal selected from the group consisting of terbium (Tb) and lutetium (Lu), and is activated with at least one rare earth element selected from the group consisting of Ce, Pr, Nd, Sm, Eu, Dy, Ho, Er and Tm, said scintillator being capable of emitting visible light in response to excitation by high-energy radiation comprising X, $\beta$, or $\gamma$ radiation.

In another aspect, the present invention comprises a scintillator having increased resistance to radiation-induced changes in scintillator efficiency comprising a garnet scintillator capable of emitting visible light in response to excitation by high-energy radiation comprising X, $\beta$, or $\gamma$ radiation, wherein said garnet scintillator comprises at least one metal selected from the group consisting of terbium (Tb) and lutetium (Lu), and is activated with at least one rare earth element selected from the group consisting of Ce, Pr, Nd, Sm, Eu, Dy, Ho, Er and Tm, and wherein said scintillator has been annealed in a controlled atmosphere comprising a predetermined amount of oxygen for a predetermined time and temperature, such that the annealed scintillator comprises a smaller radiation-induced change in efficiency than a same scintillator not treated by said annealing.

In yet another aspect, the present invention comprises a detector element of an x ray CT scanner comprising a garnet scintillator having increased resistance to radiation-induced changes in scintillator efficiency comprising a garnet scintillator capable of emitting visible light in response to excitation by high-energy radiation comprising X, $\beta$, or $\gamma$ radiation, wherein said garnet scintillator comprises at least one metal selected from the group consisting of terbium (Tb) and lutetium (Lu), and is activated with at least one rare earth element selected from the group consisting of Ce, Pr, Nd, Sm, Eu, Dy, Ho, Er and Tm, and wherein said scintillator has been annealed in a controlled atmosphere comprising a predetermined amount of oxygen for a predetermined time and temperature, such that the annealed scintillator comprises a smaller radiation-induced change in efficiency than a same scintillator not treated by said annealing.

DETAILED DESCRIPTION OF THE INVENTION

Figure 1:
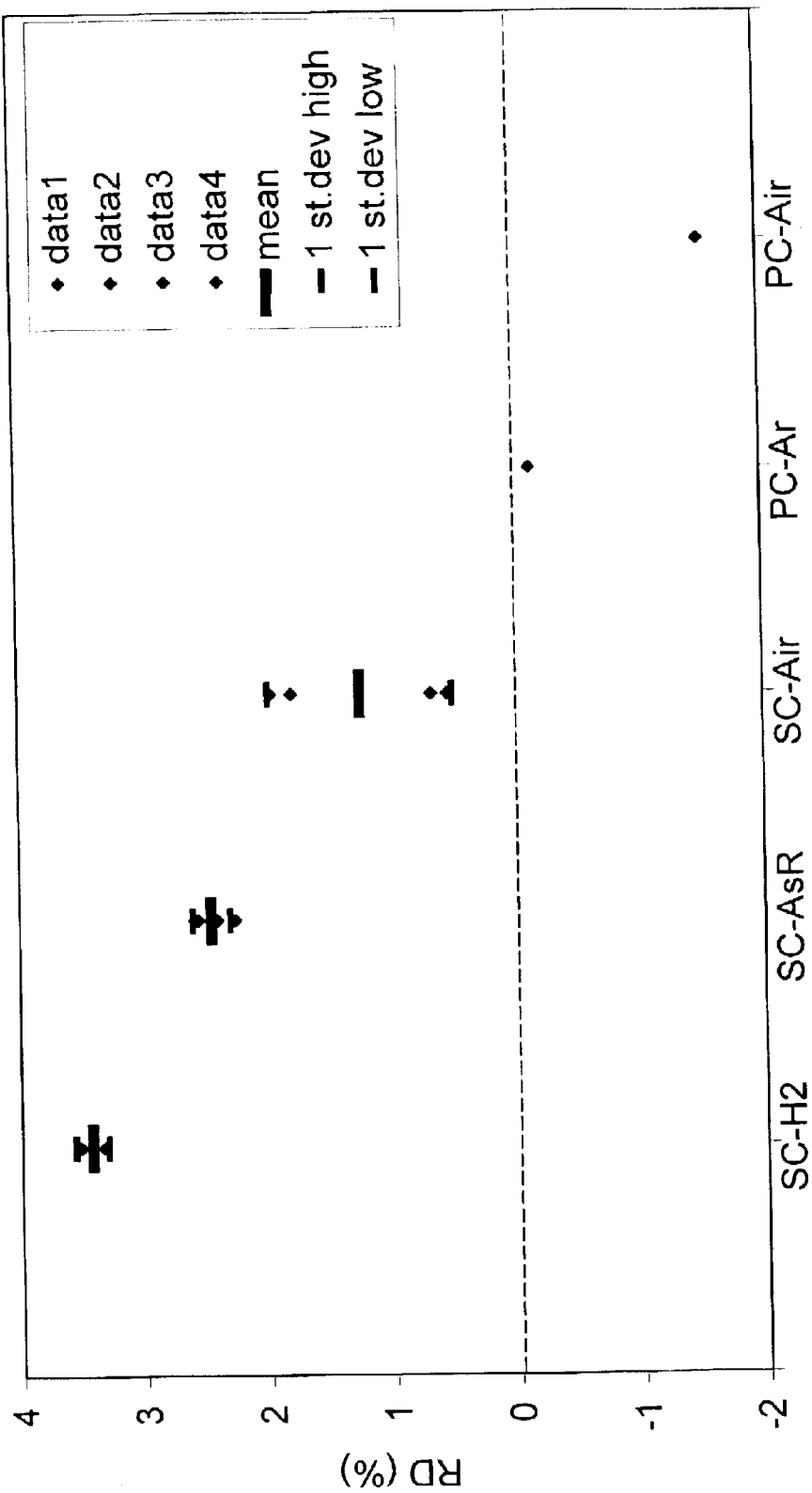
FIG. 1 shows a scatter plot of percent radiation damage (%RD) from five different sets of samples: SC—H2, single crystals (SC) heated at 1500° C. for 10 hours in a hydrogen ($H_2$) atmosphere (partial pressure of oxygen=$5 \times 10^{-13}$ atmospheres (atm)); SC-AsR, single crystals As Received (partial pressure of oxygen=$\sim 1 \times 10^{-8}$ atm); SC-Air, single crystals heated at 1500° C. for 10 h in air (partial pressure of oxygen=0.021 atm); PC-Ar, a polycrystalline (PC) plate heated at 1400° C. for 4 h in argon (partial pressure of oxygen=$1 \times 10^{-8}$ atm); and PC-Air, a polycrystalline plate, heated at 1400° C. for 4 h in air (partial pressure of oxygen=0.021 atm), in accordance with an embodiment of the present invention.

The present invention relates to terbium or lutetium aluminum oxide garnet X ray scintillators activated with a rare earth metal ion, such as cerium, and treated by heating (annealing) at high temperatures and in a defined oxygen atmosphere during or after sintering to reduce radiation damage that would otherwise occur when the scintillator material is exposed to high energy radiation. The scintillator may comprise either a single crystal or a polycrystalline scintillator having the general formula $(G_{1-x-y}A_xRE_y)_aD_zO_{12}$; wherein G is at least one metal selected from the group consisting of Tb and Lu; A is at least one rare earth metal selected from the group consisting of Y, La, Gd, Lu, and Yb when G is Tb, and selected from the group consisting of Y, La, Gd, Tb, and Yb when G is Lu; RE is at least one rare earth metal selected from the group consisting of Ce, Pr, Nd, Sm, Eu, Dy, Ho, Er, and Tm; D is at least one metal selected from the group consisting of Al, Ga, and In; a is a range from about 2.8 to and including 3.1; x is in a range from 0 to about 0.5; y is in a range from about 0.0005 to about 0.2; and z is in a range from about 4 to and including 5.1, prior to annealing. In an embodiment, the scintillator comprises a single crystal or a polycrystalline scintillator comprising the general formula $(Tb_{1-x}Lu_xCe_y)_3Al_5O_{12}$, where $0<x \leq 0.5$, and y is in the range from about 0.0005 to about 0.2, and more preferably from about 0.005 to about 0.1, prior to annealing. Thus, in one preferred embodiment, the scintillator comprises $Lu_{0.8}Tb_{2.2}Al_5O_{12}$ activated with $Ce^{3+}$ ions prior to annealing. The scintillators of the present invention have short decay times and show reduced damage upon exposure to high-energy radiation compared to scintillators not annealed by the method of the invention.

The present invention may be better understood by employing the following non-limiting definitions.

The terms "phosphor" and "scintillator" are used in an interchangeable way to mean a solid-state luminescent material that emits visible light in response to stimulation by high-energy radiation such as X, $\beta$, or $\gamma$ radiation.

The term "high-energy radiation" means electromagnetic radiation having energy higher than that of ultraviolet radiation, including but not limited to, X radiation (also referred to as x ray radiation herein), gamma ($\gamma$) radiation, and beta ($\beta$) radiation. Solid-state scintillator materials are in common use as components of radiation detectors in apparatuses such as counters, image intensifiers, and computed tomography ("CT") scanners.

The term "radiation damage" refers to the characteristic of a luminescent material in which the quantity of light emitted by the luminescent material in response to a given intensity of stimulating radiation changes after the material has been exposed to a high-energy radiation dose. The term "radiation damage" may also describe the change of scintillation efficiency due to defects created in the scintillator by the radiation dose.

As used herein, the term "light output" is the quantity of visible light emitted by the scintillator after being excited by a pulse of high energy radiation such as X ray radiation and the like.

The term "afterglow" is the light emitted by the scintillator at a defined time after the x ray excitation ceases, reported as a percentage of the light emitted while the scintillator is excited by the X radiation.

The term "decay time," "primary decay," or "primary speed" is the time required for the intensity of the light emitted to decrease to about 36.8% (or 1/e) of the light intensity at the time after the high-energy excitation ceases.

The term "stopping power" refers to the ability of a material to absorb X-radiation; this is also commonly called attenuation or absorption. A material having a high stopping power allows little or no X-radiation to pass through. The stopping power is proportional to the density of the scintillator and the elements contained therein. Thus, it is advantageous to produce scintillators having high density.

Thus, in one aspect, the present invention comprises a method for preparing a terbium or lutetium containing garnet scintillator having increased resistance to radiation-induced changes in scintillator efficiency comprising annealing a garnet scintillator in a controlled atmosphere comprising a predetermined amount of oxygen, for a predetermined time and temperature, such that the annealed scintillator comprises a smaller radiation-induced change in efficiency of signal generation than a same scintillator not treated by said annealing, wherein said garnet scintillator comprises at least one metal selected from the group consisting of terbium (Tb) and lutetium (Lu), and is activated with at least one rare earth element selected from the group consisting of Ce, Pr, Nd, Sm, Eu, Dy, Ho, Er and Tm, said scintillator being capable of emitting visible light in response to excitation by high-energy radiation comprising X, β, or γ radiation.

In another aspect, the present invention comprises a scintillator having increased resistance to radiation-induced changes in scintillator efficiency comprising a garnet scintillator capable of emitting visible light in response to excitation by high-energy radiation comprising X, β, or γ radiation, wherein said scintillator comprises at least one metal selected from the group consisting of terbium (Tb) and lutetium (Lu), and is activated with at least one rare earth element selected from the group consisting of Ce, Pr, Nd, Sm, Eu, Dy, Ho, Er and Tm, and wherein said scintillator has been annealed in a controlled atmosphere comprising a predetermined amount of oxygen for a predetermined time and temperature, such that the annealed scintillator comprises a smaller radiation-induced change in efficiency than a same scintillator not treated by said annealing.

In yet another aspect, the present invention comprises a detector element of an x ray CT scanner comprising a scintillator having increased resistance to radiation-induced changes in scintillator efficiency comprising a garnet scintillator capable of emitting visible light in response to excitation by high-energy radiation comprising X, β, or γ radiation, wherein said scintillator comprises at least one metal selected from the group consisting of terbium (Tb) and lutetium (Lu), and is activated with at least one rare earth element selected from the group consisting of Ce, Pr, Nd, Sm, Eu, Dy, Ho, Er and Tm, and wherein said scintillator has been annealed in a controlled atmosphere comprising a predetermined amount of oxygen for a predetermined time and temperature, such that the annealed scintillator comprises a smaller radiation-induced change in efficiency than a same scintillator not treated by said annealing.

In an embodiment, the scintillator is prepared by sintering. Where the scintillator is prepared by sintering, the garnet scintillator preferably comprises a polycrystalline scintillator such as a ceramic, or the like.

Alternatively, the scintillator may be prepared by a crystal growth process. Where the scintillator is prepared by a crystal growth process, the scintillator preferably comprises at least one isolated single crystal.

The annealing is conducted in a controlled (i.e. defined) atmosphere. Generally, the annealing occurs in the presence of oxygen. Preferably, the controlled oxygen atmosphere comprises an oxygen partial pressure in the range from about $1 \times 10^{-18}$ to about 1 atmosphere (atm). Preferably, the controlled oxygen atmosphere comprises an oxygen partial pressure in the range from about $1 \times 10^{-13}$ to about 1 atm. More preferably, the controlled oxygen atmosphere comprises an oxygen partial pressure in the range from about $1 \times 10^{-8}$ to about 0.5 atm. Even more preferably, the controlled oxygen atmosphere comprises an oxygen partial pressure in the range from about $1 \times 10^{-6}$ to about 0.22 atm.

Also preferably, the annealing temperature comprises a range from 1000° C. to 1500° C. More preferably, the annealing temperature ranges from 1400° C. to 1500° C.

The annealing step may be conducted during the normal cooling step which occurs after firing the scintillator material. Alternatively, the annealing may be conducted on a scintillator that has already been cooled to room temperature (i.e. by reheating). Preferably, the time period for annealing comprises a range of from 0.5 to 12 hours (h). More preferably, the time period for annealing comprises a range of from 1 to 8 hours, and even more preferably, from 1 to 4 hours.

The scintillator is preferably cooled to room temperature after the annealing step. Preferably, the rate of cooling ranges between 150° C. and 500° C. per hour. More preferably, a cooling rate of about 300° C. per hour is used.

The present invention describes the application of annealing in the presence of oxygen as a way to decrease the susceptibility of rare earth activated terbium or lutetium containing garnet scintillators to radiation-induced damage. The rare earth activated terbium or lutetium containing garnet scintillators are especially desirable because of their relatively short decay rates which as discussed herein, allow for CT systems having faster scan time.

In an embodiment, the annealing step changes the oxygen content of said scintillator. Although the exact amount of the change is difficult to quantify, it is believed that a small change in oxygen stoichiometry may occur upon treatment of garnet scintillators by the method of the present invention.

In an embodiment, prior to the annealing step, the scintillator comprises the formula $(Tb_{1-y}Ce_y)_a D_z O_{12}$; wherein D is at least one metal selected from the group consisting of Al, Ga, and In; a is in a range from about 2.8 up to and including 3.1; y is in a range from about 0.0005 up to and including 0.2; and z is in a range from about 4 up to and including 5.1.

In another embodiment, the scintillator comprises the formula $(Lu_{1-y}Ce_y)_a D_z O_{12}$; wherein D is at least one metal selected from the group consisting of Al, Ga, and In; a is in a range from about 2.8 to and including 3.1; y is in a range from about 0.0005 up to and including 0.2; and z is in a range from about 4 up to and including 5.1, prior to annealing.

In yet another embodiment, the scintillator comprises the formula $(G_{1-x-y}A_x RE_y)_a D_z O_{12}$; wherein G is at least one metal selected from the group consisting of Tb and Lu; A is at least one rare earth metal selected from the group consisting of Y, La, Gd, Lu, and Yb when G is Tb, and selected from the group consisting of Y, La, Gd, Tb, and Yb when G is Lu; RE is at least one rare earth metal selected from the group consisting of Ce, Pr, Nd, Sm, Eu, Dy, Ho, Er, and Tm; D is at least one metal selected from the group consisting of Al, Ga, and In; a is a range from about 2.8 up to and including 3.1; x is in a range from 0 up to and including 0.5; y is in a range from about 0.0005 up to and including 0.2; and z is in a range from about 4 up to and including 5.1, prior to annealing.

Also preferably, A is Lu, RE is Ce, and D is Al. Also preferably, the scintillator comprises the formula $(Tb_{1-y}Ce_y)_a Al_5 O_{12}$ where y is in a range from about 0.0005 up to and including 0.2, and a is in the range from about 2.8 up to and including 3.1, prior to annealing. In yet another preferred embodiment, the scintillator comprises the formula $(Tb_{1-x-y}Lu_xCe_y)_aAl_5O_{12}$, where a is a range from about 2.8 up to and including 3.1; x is in a range from 0 to up to and including 0.5; y is in a range from about 0.0005 up to and including 0.2, prior to annealing. Also preferably, the scintillator comprises the formula $(Tb_{1-x}Lu_xCe_y)_3Al_5O_{12}$; where $0<x\leq0.5$ and y is in a range from about 0.0005 up to and including 0.2, prior to annealing.

Preferably, for the scintillators described above, a is in a range from 2.9 up to and including 3.05. Also preferably, x is in a range from 0 to and including 0.3, and even more preferably, from 0 up to and including 0.2. Also preferably, y is in a range from 0.005 up to and including 0.1, and even more preferably, y is in a range from 0.005 up to and including 0.07. Also preferably, z is in a range from 4.5 up to and including 5.05, and even more preferably, from 4.6 up to and including 5.0.

In one preferred embodiment, the garnet scintillator has the formula of $(Tb_{1-y}Ce_y)_3(Al_{1-r-s}Ga_rIn_s)_zO_{12}$ where y is in the range from about 0.0005 up to and including 0.2, and z is in the range from about 4 up to and including 5.1, and $0\leq r\leq 0.5$ when $0<s\leq 0.5$ and $r+s<1$, or $0<r\leq 0.5$ when $0\leq s\leq 0.5$ and $r+s<1$, prior to annealing.

In another embodiment, the garnet scintillator has the formula of $(Tb_{1-y-u-v-w}Ce_yY_uGd_vSm_w)_3Al_zO_{12}$, where y is in the range from about 0.0005 up to and including 0.2; and z is in the range from about 4 up to and including 5.1, $0\leq u$, v, $w\leq0.5$, and $0.0005\leq y+u+v+w<1$, prior to annealing.

In yet another embodiment, the scintillator treated by the annealing of the present invention comprises $Lu_{0.8}Tb_{2.2}Al_5O_{12}$ activated with $Ce^{3+}$ ions.

As described herein, the scintillator of the present invention may comprise a polycrystalline sintered scintillator or may be in the form of single crystals. For a polycrystalline sintered scintillator, the scintillator is preferably prepared as follows:

(1) providing amounts of:
  (a) oxygen-containing compounds of at least one first metal selected from the group consisting of terbium and lutetium;
  (b) oxygen-containing compounds of at least one rare-earth metal selected from the group consisting of Ce, Pr, Nd, Sm, Eu, Dy, Ho, Er, and Tm;
  (c) oxygen-containing compounds of at least one second metal selected from the group consisting of Al, Ga, and In;
(2) mixing together said oxygen-containing compounds to form a mixture; and
(3) firing said mixture by calcining at a temperature for a time sufficient to convert said mixture to a rare earth-activated garnet scintillator composition;

wherein said amounts of oxygen-containing compounds are chosen to obtain the final desired composition of said scintillator.

The step of firing to generate a garnet scintillator (calcining) may comprise a temperature ranging from 700° C. to about 1500° C., more preferably, from 800° C. to about 1200° C., and even more preferably, from about 850° C. to about 1150° C.

In an embodiment, the mixed oxygen-containing compounds are packed into compact comprising a scintillator body of the desired shape, either prior to, or after the calcining firing step (step (3)). The body is then sintered at high temperature to minimize porosity of the compact. Preferably the step of sintering the compact comprises heating the pressed compact at high temperature. The sintering temperature preferably ranges from 1500° C. to 1800° C. More preferably, sintering temperatures ranging from 1600° C. to 1780° C. and even more preferably, 1675° C. to 1775° C. are used.

Radiation damage (RD) may be quantified by measuring change in the intensity of light output before and after a high energy radiation dose, where $I_I$ is the initial (pre-radiation dose) intensity of light output and $I_F$ is the final (post-radiation dose) intensity of light output. Thus, the percent radiation damage (% RD)=$[(I_F-I_I)/I_I]\times 100$. It can be seen that an increase in light output after a high-energy radiation treatment comprises a positive RD value and a decrease in light output after the radiation treatment comprises a negative RD value. However, the closer the RD value is to zero (negative or positive), the better the scintillator responds to high energy radiation without having a change in efficiency. Generally, RD values ranging from +2 to −2 percent are preferred, with values of +1 to −1 percent more preferred, and values from +0.5 to −0.5 percent even more preferred.

Thus, the present invention describes the application of annealing under a predetermined atmosphere to reduce susceptibility to radiation damage in a scintillator material. The present invention provides rare earth-activated scintillators having a garnet structure and containing terbium and/or lutetium. The present invention provides the surprising result that annealing in a defined oxygen atmosphere may be applied to either polycrystalline scintillators or a single crystal form of the scintillator as a means to increase the resistance of the scintillator to radiation damage. The finding that annealing may be used to reduce radiation damage in single crystals is not expected in light of the known poor diffusivity of oxygen through single crystal forms of such scintillators.

Radiation damage to scintillators changes the efficiency by which the scintillator is able to convert high-energy excitation radiation to a measurable signal. Thus, it is important to develop scintillators that are resistant to radiation damage so that the sensitivity of the scintillator to exciting radiation remains substantially constant over a long-term use. Stability and reproducibility of light output of a scintillator is critical to many applications. For example, radiation damage can lead to "ghost images" from prior scans which thereby reduce image resolution. Because the variation in scintillator response that occurs upon radiation damage is highly variable, it is difficult to develop quantitative correction measures. The amount and variation in scintillator efficiency that results upon x ray damage is generally undesirable in a quantitative x ray detector and limits the applicability of such imaging techniques.

In some cases, radiation damage may be controlled by homogeneous doping of scintillators with elements that reduce the concentration of defects (color centers) responsible for changing scintillator efficiency. Also, it has been shown that for a small class of $(Y,Gd)2O3$:Eu ceramic scintillators, varying the oxygen atmosphere during sintering influences damage characteristics (U.S. Pat. No. 4,783,596). However, this protective effect was found to work only for a limited class of rare earth doped yttria-gadolinia scintillator materials (U.S. Pat. No. 4,783,596).

Radiation damage causes defects in the scintillator that can then modify the scintillation efficiency for a specific radiation dose. Such defects are commonly color centers that have an electronic structure that imparts optical absorption bands at the scintillator emission wavelengths. The binding energy of the color center determines the longevity of the damage, but in general, this energy is sufficiently large that damage can last from seconds to days at room temperature.

It is difficult to account for the effects of radiation damage when using scintillators for radiographic imaging and thus, it is desirable to develop scintillators that show minimal change in efficiency upon exposure to high-energy radiation. Radiation damage is characterized experimentally by exposing the scintillator to a relevant dose of radiation and measuring the change in light output taken before and after the damage dose. The recovery can be plotted as a function of time after the end of the damage pulse. Such information may be used to distinguish radiation damage due to color center absorption or other defect centers that decrease activator emission efficiency, but is not particularly informative in predicting how a particular scintillator will respond when used clinically.

Also, several factors are important to quantifying the effect of radiation damage on scintillator function. For accurate measurements, it is important to compensate for variations in the source creating the measurement pulses. Also, scintillators with high afterglow must be compensated for residual afterglow from the radiation dose. In addition, since the absorption of the scintillation light depends on path length through the crystal, the measured damage can depend on scintillator geometry, such as crystal thickness and transparency. Also, although radiation damage typically decreases scintillation efficiency, there are some cases, e.g., CsI:Tl scintillators, where the efficiency increases. Although not fully understood, it is believed that such increased efficiency may result from the modification or neutralization of defect centers that would otherwise reduce a scintillator's efficiency.

The present invention provides rare earth-activated scintillators having a garnet structure and containing terbium and/or lutetium. The scintillators of the present invention are responsive to high-energy excitation, such as x rays, and have high light output, reduced afterglow, short decay time, and high x ray stopping power. Higher light output is advantageous because a lower amount of high-energy excitation energy is required. Thus, the patient is exposed to a lower dose of high-energy radiation. Reduced afterglow is advantageous because the image is sharper and free from image artifacts, sometimes referred to as "ghost images." Shorter decay time is preferred because the scan time can be reduced, resulting in more efficient use of the CT system. Higher stopping power is preferred because a smaller quantity of scintillator is needed. Thus, thinner detectors are possible, resulting in lower cost of manufacture. Low radiation damage is advantageous because the sensitivity of the scintillator to exciting radiation remains substantially constant over a long-term use.

The present invention provides a garnet scintillator that is efficiently excitable by x ray radiation and efficiently emits light in the visible range having a broad spectrum from blue to red (from about 500 nm to about 770 nm). The scintillator has an emission peak in the green to yellow range (from about 540 nm to about 600 nm), which includes the range of maximum sensitivity of x ray image intensifiers and photodetectors.

The scintillator of the present invention is a rare earth-activated garnet containing terbium and/or lutetium having a general formula $(G_{1-x-y}A_xRE_y)_aD_zO_{12}$, wherein G is at least one metal selected from the group consisting of Tb and Lu; A is a member selected from the group consisting of Y, La, Gd, Lu, and Yb when G is Tb and selected from the group consisting of Y, La, Gd, Tb, and Yb when G is Lu; RE is at least one member selected from the group consisting of Ce, Pr, Nd, Sm, Eu, Dy, Ho, Er, and Tm; D is at least one member selected from the group consisting of Al, Ga, and In; a is in the range from about 2.8 to and including 3.1, preferably from about 2.9 to and including 3.05; x is in the range from 0 to about 0.5, preferably from 0 to about 0.3, more preferably from 0 to about 0.2; and y is in the range from about 0.0005 to about 0.2, preferably from about 0.005 to about 0.1, more preferably from about 0.005 to about 0.07; and z is in the range from about 4 to and including 5.1, preferably from about 4.5 to and including 5.05, more preferably from about 4.6 to and including 5.

In another embodiment, the scintillator is terbium aluminum garnet activated with cerium having the formula $(Tb_{1-y}Ce_y)_aAl_5O_{12}$ where y is in the range from about 0.0005 to about 0.2, preferably from about 0.005 to about 0.1, more preferably from about 0.005 to about 0.07; and a is in the range from about 2.8 to and including 3.1, and more preferably from about 2.9 to and including 3.05.

In another embodiment, terbium is partially substituted with lutetium, and the scintillator has the formula of $(Tb_{1-x-y}Lu_xCe_y)_aAl_5O_{12}$, wherein a is in the range from about 2.8 to and including 3.1, preferably from about 2.9 to and including 3.05; x is in the range from 0 to about 0.5, preferably from 0 to about 0.3, more preferably from 0 to about 0.2; and y is in the range from about 0.0005 to about 0.2, preferably from about 0.005 to about 0.1, more preferably from about 0.005 to about 0.07.

In still another embodiment, the scintillator has the formula of $(Tb_{1-x}Lu_xCe_y)_3Al_5O_{12}$; where $0<x\leq0.5$, and y is in the range from about 0.0005 to about 0.2, preferably from about 0.005 to about 0.1, more preferably from about 0.005 to about 0.07.

In another embodiment, aluminum is partially substituted with gallium, indium, or a combination thereof. In this case, the scintillator has the formula of $(Tb_{1-y}Ce_y)_3(Al_{1-r-s}Ga_rIn_s)_zO_{12}$ where y is in the range from about 0.0005 to about 0.2, preferably from about 0.005 to about 0.1, more preferably from about 0.005 to about 0.07; and z is in the range from about 4 to and including 5.1, preferably from about 4.5 to and including 5.05, more preferably from about 4.6 to and including 5, and $0\leq r\leq0.5$ when $0<s\leq0.5$ and r+s<1, or $0<r\leq0.5$ when $0\leq s\leq0.5$ and r+s<1. Preferably, r is in a range from about 0.005 to about 0.3 and more preferably from about 0.05 to about 0.2; and s is preferably in a range from about 0.005 to about 0.3 and more preferably from about 0.05 to about 0.2.

Also, terbium may be partially substituted by one of Y, Gd, Sm, or a combination thereof and aluminum is not substituted. In this case, the scintillator has the formula of $(Tb_{1-y-u-v-w}Ce_yY_uGd_vSm_w)_3Al_zO_{12}$, where y is in the range from about 0.0005 to about 0.2, preferably from about 0.005 to about 0.1, more preferably from about 0.005 to about 0.07; and z is in the range from about 4 to and including 5.1, preferably from about 4.5 to and including 5, more preferably from about 4.6 to and including 5, $0\leq u, v, w\leq0.5$, and $0.0005\leq y+u+v+w<1$. Each of u, v, and w is preferably in a range from about 0.005 to about 0.3 and more preferably from about 0.005 to about 0.1.

In still another preferred embodiment, the scintillator has the formula of $(Tb_{1-x-y}A_xCe_y)_3Al_zO_{12}$, where A is Y or Gd, $0<x\leq0.5$, and y is in the range from about 0.0005 to about 0.2, preferably from about 0.005 to about 0.1, more preferably from about 0.005 to about 0.07; and z is in the range from about 4 to and including 5.1, preferably from about 4.5 to and including 5, more preferably from about 4.6 to and including 5.

A scintillator composition of the present invention may be prepared by a dry or wet synthesis method. A scintillator of the present invention useful for a detection of high-energy radiation such as X, β, or γ radiation is produced by a dry synthesis method comprising the steps of: (1) providing amounts of oxygen-containing compounds of at least one first metal selected from the group consisting of terbium and lutetium; oxygen-containing compounds of at least one rare-earth metal selected from the group consisting of Y, La, Ce, Pr, Nd, Sm, Eu, Gd, Dy, Ho, Er, Tm, and Yb; and oxygen-containing compounds of at least one second metal selected from the group consisting of Al, Ga, and In; the amounts of oxygen-containing compounds being selected such that the final composition of the scintillator is achieved; (2) mixing together the oxygen-containing compounds to form a mixture; (3) firing (calcining) the mixture at a temperature and for a time sufficient to convert the mixture to a rare earth-activated terbium-containing garnet scintillator and optionally, packing the mixture into a scintillator body of the desired shape; (4) sintering the compacted powder at a temperature and for a time sufficient to remove porosity and yield a translucent or transparent wafer; and (5) annealing the scintillator a controlled oxygen-containing atmosphere for a predetermined time and temperature, such that the annealed scintillator comprises a smaller radiation-induced efficiency loss than a same scintillator not treated by said annealing.

The oxygen-containing compounds may be mixed together by any mechanical method including, but not limited to, stirring or blending in a high-speed blender or a ribbon blender. The oxygen-containing compounds may be combined and pulverized together in a bowl mill, a hammer mill, or a jet mill. The mixing may be carried out by wet milling especially when the mixture of the oxygen-containing compounds is to be made into a solution for subsequent precipitation. If the mixture is wet, it may be dried first before being fired.

Thus, in an embodiment, three distinct heating steps (calcining, sintering and annealing) may be used to prepare a scintillator of the present invention. Depending on the reactivity of the precursor powder, calcining may comprise various temperature ranges. For powder scintillant, calcining may comprise a temperature from about 700° C. to about 1500° C., preferably from about 800° C. to about 1200° C., more preferably from about 850° C. to about 1150° C. for a time sufficient to convert all of the mixture to the final garnet composition. For the compact (solid body) scintillant, sintering may comprise a temperature from about 1500° C. to about 1800° C., preferably from about 1600° C. to about 1780° C., more preferably from about 1675° C. to about 1775° C. for a time sufficient to convert all of the mixture to the final garnet composition. Finally, as described herein, annealing comprises heating the scintillator in a defined oxygen atmosphere for a predetermined time at 1000° C. to about 1500° C., and more preferably from about 1400° C. to about 1500° C.

For the wet synthesis method, drying may be conducted at atmospheric or subatmospheric pressure in air or under a flow of a suitable gas including inert gases and mixtures of air and inert gases at a temperature sufficient to remove a portion of or substantially all solvent used in the wet milling process. The firing (calcining) may be conducted in a batchwise or continuous process, preferably with a stirring or mixing action to promote good gas-solid contact. The firing time depends on the quantity of the mixture to be fired, the rate of gas conducted through the firing equipment, and the quality of the gas-solid contact in the firing equipment. Typically, a firing time up to about 10 hours is adequate.

The powder may be cast with the addition of a binder into a green element, then further sintered at temperature in the range of from about 1500° C. to about 1800° C. to increase the density of the element. In an embodiment, the scintillator material is packed into a compact comprising a scintillator body of the desired shape. The body is then sintered at high temperature to minimize porosity of the compact. Preferably the step of sintering the compact scintillator body comprises heating the pressed compact at high temperature. For firing a compact, the temperature preferably ranges from 1500° C. to 1800° C. More preferably, temperatures ranging from 1600° C. to 1780° C. and even more preferably, 1675° C. to 1775° C. are used.

After the step of firing (i.e., sintering), annealing under a defined atmosphere of oxygen is performed. The annealing may take place while the scintillator is still hot from the firing (as a partial cooling in combination with annealing). Alternatively, the annealing may be performed to scintillators that have already been cooled, by reheating the scintillator to 1000° C. to 1500° C., and more preferably, from 1400° C. to 1500° C. in the presence of oxygen. The partial pressure of oxygen during the annealing may range from $1 \times 10^{-18}$ atm up to and including 1 atm, more preferably from $1 \times 10^{-13}$ atm up to and including 1 atm, more preferably from $1 \times 10^{-8}$ atm up to and including 0.5 atm, and even more preferably from $1 \times 10^{-6}$ atm up to and including 0.22 atm. In an embodiment, the scintillator is cooled to room temperature after the annealing step.

Thus, a particular anneal treatment given to the scintillators of the present invention provides increased resistance to radiation damage and can be carried out in a simple as well as direct manner. As the sintering operation is ordinarily achieved by heating a pressed compact of the high purity metal oxide ingredients at temperatures in the range 1600° C. to 1800° C., the anneal can be achieved while the sintered material is cooled to ambient conditions. Such an annealing modification simply requires that the sintered material be cooled in the temperature range about 1500° C. to 1000° C. for several hours in a controlled oxygen containing atmosphere at partial oxygen pressures between about $1 \times 10^{-18}$ to 1 atmosphere. Alternately, a suitable anneal can be achieved by reheating the already sintered ceramic to the upper annealing temperature (1500° C.) for several hours at the appropriate atmosphere, and thereafter cooling said ceramic at a typical cooling rate. For example, in an embodiment a typical cooling rate is 150° C. to 500° C. per hour. Preferably, the cooling rate is about 300° C. per hour. A suitable atmosphere for either type of annealing step can be provided with an inert gas, such as argon, which includes the required oxygen partial pressures. Also, pure oxygen and air maintained at sub-atmospheric conditions may also be used.

In an embodiment, polycrystalline scintillator material is subjected to annealing in a defined oxygen atmosphere. Alternatively, single crystals may be annealed in an oxygen atmosphere to thereby to reduce susceptibility to radiation damage. This result is surprising in that it would not be expected that the diffusivity of oxygen would be high enough in a single crystal to change the stoichiometry of the scintillator. In most systems, the oxygen diffusivity is many more orders of magnitude faster along the grain boundaries than through the actual grains. For example, in an embodiment, the oxygen diffusivity in an approximately 2 mm thick plate of $Lu_{0.8}Tb_{2.2}Al_5O_{12}$ is sufficiently high to permit oxygen stoichiometric adjustments. Thus, when single crystalline plates were subjected to oxygen partial pressure of $3 \times 10^{-18}$ at 1500° C. for 10 hours (h), the plate turned from a light yellow to a dark green, indicative of a scintillator having reduced oxygen content. The plate was homogeneous in color without any sign of color gradients, indicating that the oxygen diffusivity is high in a single crystal.

EXAMPLE

As shown in FIG. 1, radiation damage (% RD) from five different sets of samples that were either measured "As Received" or subjected to various conditions of annealing. All experiments used scintillators of $Lu_{0.8}Tb_{2.2}Al_5O_{12}$ activated with $Ce^{3+}$ ions.

Polycrystalline scintillator ceramic was prepared by sintering the garnet powder in a furnace at 1725° C. Single crystals were purchased commercially from Poly-Scientific (Northrop Grumman, N.C.). One method to prepare single crystals is by the Czochralski method, in which the elements are mixed in a crucible and then melted using low energy radio frequency induction or by resistance heating. A pull rod with a chuck containing a seed crystal at its lower end is then dipped into the crucible. The melt temperature is adjusted so that a meniscus is formed along the seed crystal. The pull rod is simultaneously rotated and lifted. Upon adjustment of power to the melt, a crystal is pulled from the melt.

To measure radiation-induced changes in single crystal scintillators, radiation damage was measured for 4 single crystal wafers. Initial measurements of the intensity of initial (pre-high energy radiation dose) light output ($I_I$) using a Si-photodiode over an emission band centered at about 590 nm (but which includes from about 500 to 700 nm) were taken using an input radiation of 60 kvp (kilo volt power), 5 mA x rays for 0.5 seconds (a standard radiation pulse). The wafers were then subjected to a high energy dose of radiation 120 kvp, 250 mA x rays for 12 seconds. The post-radiation light output (Final Intensity=$I_F$) was then measured 35 seconds later, again using an input radiation of 60 kvp, 5 mA x rays for 0.5 seconds. Radiation damage is then quantified as RD (%)=($I_F$–$I_I$)/$I_I$, ×100, such that an increase in light output after the radiation treatment comprises a positive RD value and a decrease in light output after the radiation treatment comprises a negative RD value. The closer the RD value is to zero, the better the scintillator responds to high energy radiation without having a change in efficiency. Generally, RD values ranging from +2 to –2 percent are preferred, with values of +1 to –1 percent more preferred, and values from +0.5 to –0.5 percent even more preferred.

Results are shown in FIG. 1. SC—AsR describes experiments measuring radiation damage for single crystals (n=4) As Received (partial pressure of oxygen=~$1\times10^{-8}$ atm) with no annealing performed. For these crystals, radiation damage was found to be 2.4515% (1 standard deviation (SD)= 0.149449).

Two of the crystals (SC—H2) were then annealed in wet hydrogen ($H_2$) at 1500° C. for 10 hours (partial pressure of oxygen=$5\times10^{-13}$ atm). It was found that there was an increase in radiation damage to 3.4288% (1 SD=0.13237). Two of the crystals were annealed in dry hydrogen; these crystals turned dark, and measurements of radiation damage were not performed.

The four single crystal scintillator plates were then annealed by heating at 1500° C. for 10 h in air (partial pressure of oxygen=0.021 atm) (Sc-Air) and radiation damage measured as above. It was found that there was a reduction in radiation-induced damage, such that the mean radiation damage over the four crystals was about 1.24% (1 SD=0.7384).

Radiation damage was also measured for ceramic polycrystalline scintillators. Thus, PC-Ar describes an experiment for a polycrystalline plate heated at 1400° C. for 4 hours in an argon atmosphere (partial pressure of oxygen= $1\times10^{-8}$ atm), resulting in an percent RD value of –0.14. Finally PC-Air, describes an experiment in which a polycrystalline plate was heated at 1400° C. for 4 h in air (partial pressure of oxygen=0.021 atm). It was found that for this material, the RD value upon treatment as described above was –1.526 percent. Without any annealing (i.e., directly from the hydrogen furnace) the polycrystalline plates are dark red in color and will emit little light.

Thus, it was found that samples at about 1400° C. to 1500° C. in an atmosphere comprising a partial pressure of $5\times10^{-13}$ to 0.021 atm oxygen results in a significant change in radiation damage. Surprisingly, the effect was seen for single crystals as well as polycrystalline material.

Thus, the present invention provides a simple procedure to reduce radiation damage in this particular family of scintillators. It is not a straightforward matter to correct for irregularities in scintillator response due to radiation damage. Software corrections can be extremely complex to implement, and often do not account for hysteresis behavior of the light output from radiation damage under the many environments encountered during field use. Essentially, effective software corrections require tracking the absorbed dose for each pixel and then making a gain adjustment (to compensate for radiation damage) with each exposure. The methods of the resent invention provide significant improvements in reducing radiation damage. Additionally, the methods and compositions described in the present invention provide increased resistance to radiation damage with little to no impact on other important scintillator properties such as light output or afterglow.

What is claimed is:

1. A method for preparing a terbium or lutetium containing garnet scintillator having increased resistance to radiation-induced changes in scintillator efficiency comprising annealing a garnet scintillator in a controlled atmosphere comprising a predetermined amount of oxygen for a predetermined time and temperature, such that the annealed scintillator comprises a smaller radiation-induced change in efficiency of signal generation than a same scintillator not treated by said annealing, wherein said garnet scintillator comprises at least one metal selected from the group consisting of terbium (Tb) and lutetium (Lu), and is activated with at least one rare earth element selected from the group consisting of Ce, Pr, Nd, Sm, Eu, Dy, Ho, Er and Tm, said scintillator being capable of emitting visible light in response to excitation by high-energy radiation comprising X, β, or γ radiation.

2. The method of claim 1, wherein said scintillator is prepared by sintering.

3. The method of claim 2, wherein said scintillator comprises a polycrystalline ceramic.

4. The method of claim 1, wherein said scintillator is prepared by a crystal growth process.

5. The method of claim 4, wherein said scintillator comprises at least one isolated single crystal.

6. The method of claim 1, wherein the controlled oxygen atmosphere comprises an oxygen partial pressure in the range from $1\times10^{-18}$ atm up to and including 1 atm.

7. The method of claim 1, wherein the controlled oxygen atmosphere comprises an oxygen partial pressure in the range from $1\times10^{-13}$ atm up to and including 1 atm.

8. The method of claim 1, wherein the controlled oxygen atmosphere comprises an oxygen partial pressure in the range from $1\times10^{-8}$ atm up to and including 0.5 atm.

9. The method of claim 1, wherein the controlled oxygen atmosphere comprises an oxygen partial pressure in the range from $1\times10^{-6}$ atm up to and including 0.22 atm.

10. The method of claim 1, wherein the annealing temperature comprises a range from 1000° C. to 1500° C.

11. The method of claim 1, wherein the annealing temperature comprises a range from 1400° C. to 1500° C.

12. The method of claim 1, wherein the time period for annealing comprises a range from 0.5 to 12 hours (h).

13. The method of claim 1, wherein the time period for annealing comprises a range from 1 to 8 hours (h).

14. The method of claim 1, wherein the time period for annealing comprises a range from 1 to 4 hours (h).

15. The method of claim 1, wherein the scintillator is cooled to room temperature after said annealing.

16. The method of claim 15, wherein the rate of cooling to room temperature ranges between 150° C. and 500° C. per hour.

17. The method of claim 1, wherein prior to annealing, said scintillator comprises the formula $(Tb_{1-y}Ce_y)_aD_zO_{12}$; wherein D is at least one metal selected from the group consisting of Al, Ga, and In; a is in a range from about 2.8 up to and including 3.1; y is in a range from 0.0005 up to including 0.2; and z is in a range from 4 up to and including 5.1.

18. The method of claim 1, wherein prior to annealing, said garnet scintillator comprises the formula $(Lu_{1-y}Ce_y)_aD_zO_{12}$; wherein D is at least one metal selected from the group consisting of Al, Ga, and In; a is in a range from 2.8 up to and including 3.1; y is in a range from 0.0005 up to and including 0.2; and z is in a range from 4 up to and including 5.1.

19. The method of claim 1, wherein prior to annealing, said garnet scintillator comprises the formula $(G_{1-x-y}A_xRE_y)_aD_zO_{12}$; wherein G is at least one metal selected from the group consisting of Tb and Lu; A is at least one rare earth metal selected from the group consisting of Y, La, Gd, Lu, and Yb when G is Tb and selected from the group consisting of Y, La, Gd, Tb, and Yb when G is Lu; RE is at least one rare earth metal selected from the group consisting of Ce, Pr, Nd, Sm, Eu, Dy, Ho, Er, and Tm; D is at least one metal selected from the group consisting of Al, Ga, and In; a is a range from about 2.8 up to and including 3.1; x is in a range from 0 up to and including 0.5; y is in a range from 0.0005 up to and including 0.2; and z is in a range from 4 up to and including 5.1.

20. The method of claim 19, wherein A is Lu, RE is Ce, and D is Al.

21. The method of claim 19, wherein said scintillator comprises the formula $(Tb_{1-y}Ce_y)_aAl_5O_{12}$.

22. The method of claim 19, wherein said scintillator comprises the formula $(Tb_{1-x-y}Lu_xCe_y)_aAl_5O_{12}$.

23. The method of claim 19, wherein said scintillator comprises the formula $(Tb_{1-x}Lu_xCe_y)_3Al_5O_{12}$, where $0<x\leq 0.5$.

24. The method of claim 1, wherein prior to annealing, said garnet scintillator has the formula of $(Tb_{1-y}Ce_y)_3(Al_{1-r-s}Ga_rIn_s)_zO_{12}$ where y is in the range from about 0.0005 up to and including 0.2, and z is in the range from about 4 up to and including 5.1, and $0\leq r\leq 0.5$ when $0s<0.5$ and $r+s\leq 1$, or $0<R\leq 0.5$ when $0\leq s\leq 0.5$ and r+s 1.

25. The method of claim 1, wherein prior to annealing, said garnet scintillator has the formula of $(Tb_{1-y-u-v-w}Ce_yY_uGd_vSm_w)_3Al_zO_{12}$, where y is in the range from about 0.0005 up to and including 0.2; and z is in the range from about 4 up to and including 5.1, $0\leq u$, v, $w\leq 0.5$, and $0.0005\leq y+u+v+w<1$.

26. The method of claim 1, wherein prior to annealing, said garnet scintillator has the formula of $(Tb_{1-x-y}A_xCe_y)_3Al_zO_{12}$, where A is Y or Gd, $0<x\leq 0.5$, and y is in the range from about 0.0005 up to and including 0.2, and z is in the range from about 4 up to and including 5.1.

27. The method of claim 1, wherein prior to annealing, said garnet scintillator comprises $Lu_{0.8}Th_{2.2}Al_5O_{12}$ activated with $Ce^{3+}$ ions.

28. The method of claim 1, wherein said annealing step changes the oxygen content of the scintillator.

29. The method of claim 2, wherein said sintered scintillator is prepared by the following steps:
(a) providing amounts of:
(i) oxygen-containing compounds of at least one first metal selected from the group consisting of terbium and lutetium;
(ii) oxygen-containing compounds of at least one rare-earth metal selected from the group consisting of Ce, Pr, Nd, Sm, Eu, Dy, Ho, Er, and Tm; and
(iii) oxygen-containing compounds of at least one second metal selected from the group consisting of Al, Ga, and In, wherein said amounts of oxygen-containing compounds are chosen to obtain the final desired composition of said scintillator; and
(b) mixing together said oxygen-containing compounds to form a mixture; and
(c) firing said mixture by calcining at a temperature for a time sufficient to convert said mixture to a rare earth-activated garnet scintillator of defined composition.

30. The method of claim 29, wherein said calcining comprises firing at a temperature that ranges from 700° C. to 1500° C.

31. The method of claim 29, wherein said calcining comprises firing at a temperature that ranges from 800° C. to 1200° C.

32. The method of claim 29, further comprising packing the calcined oxygen-containing compounds into compact comprising a scintillator body of the desired shape.

33. The method of claim 32, further comprising sintering the compacted scintillator body by firing at high temperature to minimize porosity of the compact.

34. The method of claim 33, wherein the sintering temperature ranges from 1500° C. to 1800° C.

35. The method of claim 33, wherein the sintering temperature ranges from 1600° C. to 1780° C.

36. The method of claim 1, wherein said annealed scintillator comprises a change in efficiency of light emission having an absolute value of 2% or less upon treatment with high energy X radiation.

37. A scintillator having increased resistance to radiation-induced changes in scintillator efficiency comprising a garnet scintillator capable of emitting visible light in response to excitation by high-energy radiation comprising X, β, or γ radiation, wherein said garnet scintillator comprises at least one metal selected from the group consisting of terbium (Tb) and lutetium (Lu), and is activated with at least one rare earth element selected from the group consisting of Ce, Pr, Nd, Sm, Eu, Dy, Ho, Er and Tm, and wherein said scintillator has been annealed in a controlled atmosphere containing a predetermined amount of oxygen for a predetermined time and temperature, such that the annealed scintillator comprises a smaller radiation-induced change in efficiency than a same scintillator not treated by said annealing.

38. The garnet scintillator of claim 37, wherein said scintillator comprises a polycrystalline ceramic.

39. The garnet scintillator of claim 37, wherein said scintillator comprises at least one isolated single crystal.

40. The garnet scintillator of claim 37, wherein the annealed scintillator comprises an altered oxygen content as compared to the oxygen content of said scintillator prior to annealing.

41. The garnet scintillator of claim 37, wherein the controlled oxygen atmosphere comprises an oxygen partial pressure in the range from $1\times10^{-18}$ atm up to and including 1 atmosphere (atm).

42. The garnet scintillator of claim 37, wherein the controlled oxygen atmosphere comprises an oxygen partial pressure in the range from $1\times10^{-8}$ atm up to and including 1 atm.

43. The garnet scintillator of claim 37, wherein the controlled oxygen atmosphere comprises an oxygen partial pressure in the range from $1\times10^{-8}$ atm up to and including 0.5 atm.

44. The garnet scintillator of claim 37, wherein the controlled oxygen atmosphere comprises an oxygen partial pressure in the range from $1\times10^{-6}$ atm up to and including 0.22 atm.

45. The garnet scintillator of claim 37, wherein the annealing temperature comprises a range from 1000° C. to 1500° C.

46. The garnet scintillator of claim 37, wherein the annealing temperature comprises a range from 1400° C. to 1500° C.

47. The garnet scintillator of claim 37, wherein the time period for annealing comprises a range from 0.5 to 12 hours (h).

48. The garnet scintillator of claim 37, wherein the time period for annealing comprises a range from 1 to 8 hours (h).

49. The garnet scintillator of claim 37, wherein the time period for annealing comprises a range from 1 to 4 hours (h).

50. The garnet scintillator of claim 37, wherein the scintillator is cooled to room temperature after annealing.

51. The garnet scintillator of claim 50, wherein the rate of cooling to room temperature ranges between 150° C. and 500° C. per hour.

52. The garnet scintillator of claim 37, wherein prior to annealing, said garnet scintillator comprises the formula $(Tb_{1-y}Ce_y)_aD_zO_{12}$; wherein D is at least one metal selected from the group consisting of Al, Ga, and In; a is in a range from 2.8 up to and including 3.1; y is in a range from 0.0005 up to and including 0.2; and z is in a range from 4 to and including 5.1.

53. The garnet scintillator of claim 37, wherein prior to annealing, said scintillator comprises the formula $(Lu_{1-y}Ce_y)_aD_zO_{12}$; wherein D is at least one metal selected from the group consisting of Al, Ga, and In; a is in a range from 2.8 up to and including 3.1; y is in a range from 0.0005 up to including 0.2; and z is in a range from 4 up to and including 5.1.

54. The garnet scintillator of claim 37, wherein prior to annealing, said scintillator comprises the formula $(G_{1-x-y}A_xRE_y)_aD_zO_{12}$; wherein G is at least one metal selected from the group consisting of Tb and Lu; A is at least one rare earth metal selected from the group consisting of Y, La, Gd, Lu, and Yb when G is Tb and selected from the group consisting of Y, La, Gd, Tb, and Yb when G is Lu; RE is at least one rare earth metal selected from the group consisting of Ce, Pr, Nd, Sm, Eu, Dy, Ho, Er, and Tm; D is at least one metal selected from the group consisting of Al, Ga, and In; a is a range from about 2.8 up to and including 3.1; x is in a range from 0 up to and including 0.5; y is in a range from 0.0005 up to and including 0.2; and z is in a range from 4 up to and including 5.1.

55. The scintillator of claim 54, wherein a is in a range from 2.9 up to and including 3.05.

56. The scintillator of claim 54, wherein x is in a range from 0 up to and including 0.3.

57. The scintillator of claim 54, wherein x is in a range from 0 up to and including 0.2.

58. The scintillator of claim 54, wherein y is in a range from 0.005 up to and including 0.1.

59. The scintillator of claim 54, wherein y is in a range from 0.005 up to and including 0.07.

60. The scintillator of claim 54, wherein z is in a range from 4.5 up to and including 5.05.

61. The scintillator of claim 54, wherein z is in a range from 4.6 up to and including 5.0.

62. The scintillator body of claim 54, wherein A is Lu, RE is Ce, and D is Al.

63. The scintillator of claim 54, wherein said scintillator comprises the formula $(Tb_{1-y}Ce_y)_aAl_5O_{12}$.

64. The scintillator of claim 54, wherein said scintillator comprises the formula $(Tb_{1-x-y}Lu_xCe_y)_aAl_5O_{12}$.

65. The scintillator of claim 54, wherein, said scintillator comprises the formula $(Tb_{1-x}Lu_xCe_y)_3Al_5O_{12}$, where $0<x\leq0.5$.

66. The scintillator of claim 37, wherein prior to annealing, said garnet scintillator has the formula of $(Tb_{1-y}Ce_y)_3(Al_{1-R-s}Ga_rIn_s)_zO_{12}$ where y is in the range from about 0.0005 to about 0.2, and z is in the range from about 4 to and including 5.1, and $0\leq r\leq0.5$ when $0<s\leq0.5$ and $r+s<1$, or $0<r\leq0.5$ when $0\leq s\leq0.5$ and $r+s<1$.

67. The scintillator of claim 37, wherein prior to annealing, said garnet scintillator has the formula of $(Tb_{1-y-u-v-w}Ce_yY_uGd_vSm_w)_3Al_zO_{12}$, where y is in the range from about 0.0005 to about 0.2; and z is in the range from about 4 to and including 5.1, $0\leq u, v, w\leq0.5$, and $0.0005\leq y+u+v+w<1$.

68. The scintillator of claim 37, wherein prior to annealing, said garnet scintillator has the formula of $(Tb_{1-x-y}A_xCe_y)_3Al_zO_{12}$, where A is Y or Gd, $0<x\leq0.5$, and y is in the range from about 0.0005 up to and including 0.2, and z is in the range from about 4 up to and including 5.1.

69. The scintillator body of claim 37, wherein prior to annealing, the scintillator comprises $Lu_{0.8}Tb_{2.2}Al_5O_{12}$ activated with $Ce^{3+}$ ions.

70. The scintillator body of claim 37, wherein said annealed scintillator comprises a change in efficiency of light emission having an absolute value of 2% or less upon treatment with high energy X radiation.

71. A detector element of an x ray CT scanner comprising the scintillator of claim 37.

72. A detector element of an x ray CT scanner comprising the scintillator of claim 54.

73. The method of claim 1, wherein said annealed scintillator comprises a change in efficiency of light emission having an absolute value of 1% or less upon treatment with high energy X radiation.

74. The scintillator body of claim 37, wherein said annealed scintillator comprises a change in efficiency of light emission having an absolute value of 1% or less upon treatment with high energy X radiation.

75. A detector element of a PET scanner comprising the scintillator of claim 37.

76. A detector element of a PET scanner comprising the scintillator of claim 54.

77. A method for preparing a terbium or lutetium containing garnet scintillator having increased resistance to radiation-induced changes in scintillator efficiency comprising annealing a garnet scintillator in a controlled atmosphere comprising a predetermined amount of oxygen for a predetermined time and temperature, such that the annealed scintillator comprises a smaller radiation-induced change in efficiency of signal generation than a same scintillator not treated by said annealing, wherein said garnet scintillator comprises at least one metal selected from the group consisting of terbium (Tb) and lutetium (Lu), and is activated with at least one rare earth element selected from the group consisting of Ce, Pr, Nd, Sm, Eu, Dy, Ho, Er and Tm, said scintillator being capable of emitting visible light in response to excitation by high-energy radiation comprising X, β, or γ radiation, and wherein the controlled oxygen atmosphere comprises an oxygen partial pressure of from about $1\times10^{-18}$ atm to about 1 atm, the annealing temperature comprises a range from about 1000° C. to about 1500° C., and the time period for annealing comprises at least 0.5 hours.

78. A scintillator having increased resistance to radiation-induced changes in scintillator efficiency comprising a garnet scintillator capable of emitting visible light in response to excitation by high-energy radiation comprising X, β, or γ radiation, wherein said garnet scintillator comprises at least one metal selected from the group consisting of terbium (Tb) and lutetium (Lu), and is activated with at least one rare earth element selected from the group consisting of Ce, Pr, Nd, Sm, Eu, Dy, Ho, Er and Tm, and wherein said scintillator has been annealed in a controlled atmosphere containing a predetermined amount of oxygen for a predetermined time and temperature, such that the annealed scintillator comprises a smaller radiation-induced change in efficiency than a same scintillator not treated by said annealing, and wherein the controlled oxygen atmosphere comprises an oxygen partial pressure of from about $1\times10^{-18}$ atm to about 1 atm, the annealing temperature comprises a range from about 1000° C. to about 1500° C., and the time period for annealing comprises at least 0.5 hours.

* * * * *

UNITED STATES PATENT AND TRADEMARK OFFICE
CERTIFICATE OF CORRECTION

PATENT NO.    : 6,793,848 B2
DATED         : September 21, 2004
INVENTOR(S)   : James Scott Vartuli et al.

It is certified that error appears in the above-identified patent and that said Letters Patent is hereby corrected as shown below:

Title page,
Item [75], Inventors, "Steven Jude Ductos" should read -- Steven Jude Duclos --
Item [56], References Cited, OTHER PUBLICATIONS, that portion reading "Chani, V.E. et al., Melt Growth of (Tb,Lu)$_3$ Al$_5$O$_{12}$ Mixed" should read -- Chani, V.E. et al., Melt Growth of (Tb,Lu)$_3$ Al$_5$O$_{12}$ Mixed --; and that portion reading "Aluminum Garnet. Cryst. Res. Technol., 34: 5-8, 615-619," should read -- Aluminum Garnet", Cryst. Res. Technol., 34: 5-6, 615-619, --

Column 3,
Line 61, that portion reading "oxygen=0.021 atm), in accordance with an embodiment of" should read -- oxygen=0.21 atm), in accordance with an embodiment of --

Column 4,
Line 25, that portion reading "the scintillator comprises Lu$_{0.8}$Tb$_{2.2}$Al$_5$O$_{12}$ activated with" should read -- the scintillator comprises Lu$_{0.8}$Tb$_{2.2}$Al$_5$O$_{12}$ activated with --

Column 7,
Line 32, that portion reading "Tb$_{2.2}$Al$_5$O$_{12}$ activated with Ce$^{3+}$ ions." should read -- Tb$_{2.2}$Al$_5$O$_{12}$ activated with Ce$^{3+}$ ions. --

Column 12,
Line 61, that portion reading "mm thick plate of Lu$_{0.8}$Tb$_{2.2}$Al$_5$O$_{12}$ is sufficiently high to" should read -- mm thick plate of Lu$_{0.8}$Tb$_{2.2}$Al$_5$O$_{12}$ is suffciently high to --

Column 13,
Line 5, that portion reading "All experiments used scintillators of Lu$_{0.8}$Tb$_{2.2}$Al$_5$O$_{12}$" should read -- All experiments used scintillators of Lu$_{0.8}$Tb$_{2.2}$Al$_5$O$_{12}$ --
Line 59, that portion reading "pressure of oxygen=0.021 atm) (Sc-Air) and radiation dam-" should read -- pressure of oxygen=0.21 atm) (Sc-Air) and radiation dam- --

Column 14,
Line 4, that portion reading "pressure of oxygen=0.021 atm). It was found that for this" should read -- pressure of oxygen=0.21 atm). It was found that for this --
Line 11, that portion reading "5x10$^{-13}$" to 0.021 atm oxygen results in a significant change" should read -- 5x10$^{-13}$ to 0.21 atm oxygen results in a significant change --
Line 25, that portion reading "methods of the resent invention provide significant improve-" should read - methods of the present invention provide significant improve- --

UNITED STATES PATENT AND TRADEMARK OFFICE
CERTIFICATE OF CORRECTION

PATENT NO. : 6,793,848 B2
DATED : September 21, 2004
INVENTOR(S) : James Scott Vartuli et al.

It is certified that error appears in the above-identified patent and that said Letters Patent is hereby corrected as shown below:

Column 15,
Line 17, that portion reading "said scintillator comprises the formula $(Th_{1-y}Ce_y)_aD_zO_{12}$;" should read -- said scintillator comprises the formula $(Tb_{1-y}Ce_y)_aD_zO_{12}$; --
Lines 63 and 64, that portion reading "about 4 up to and including 5.1, and $0 \le r \le 0.5$ when $0s \le 0.5$ and $r+s \le 1$, or $0 \le R \le 0.5$ when $0 \le s \le 0.5$ and r+s 1." should read -- about 4 up to and including 5.1, and $0 \le r \le 0.5$ when $0<s \le 0.5$ and $r+s \le 1$, or $0 \le r \le 0.5$ when $0 \le s \le 0.5$ and $r+s \le 1$. --

Column 16,
Line 4, that portion reading "said garnet scintillator comprises $Lu_{0.8}Th_{2.2}Al_5O_{12}$ acti-" should read -- said garnet scintillator comprises $Lu_{0.8}Tb_{2.2}Al_5O_{12}$ acti- --

Column 17,
Line 6, that portion reading "pressure in the range from $1 \times 10^{-8}$ atm up to and including" should read -- pressure in the range from $1 \times 10^{-13}$ atm up to and Including --

Column 18,
Line 20, that portion reading "$Ce_y)_3(Al_{1-R-s}Ga_rIn_s)_zO_{12}$ where y is in the range from about" should read -- $Ce_y)_3(Al_{1-r-s}Ga_rIn_s)_zO_{12}$ where y is in the range from about --

Column 19,
Line 1, that portion reading "sisting of terbium (Th) and lutetium (Lu), and is activated" should read -- sisting of terbium (Tb) and lutetium (Lu), and is activated --

Signed and Sealed this

Fifth Day of April, 2005

JON W. DUDAS
*Director of the United States Patent and Trademark Office*

UNITED STATES PATENT AND TRADEMARK OFFICE
CERTIFICATE OF CORRECTION

PATENT NO. : 6,793,848 B2
DATED : September 21, 2004
INVENTOR(S) : James Scott Vartuli et al.

It is certified that error appears in the above-identified patent and that said Letters Patent is hereby corrected as shown below:

Title page,
Item [75], Inventors, "Steven Jude Ductos" should read -- Steven Jude Duclos --
Item [56], References Cited, OTHER PUBLICATIONS, that portion reading
"Chani, V.E. et al., Melt Growth of $(Tb,Lu)_3 Al_5O_{12}$ Mixed" should read -- Chani, V.E. et al., Melt Growth of $(Tb,Lu)_3 Al_5O_{12}$ Mixed --; and that portion reading
"Aluminum Garnet. Cryst. Res. Technol., 34: 5-8, 615-619," should read -- Aluminum Garnet", Cryst. Res. Technol., 34: 5-6, 615-619, --

Column 3,
Line 61, that portion reading "oxygen=0.021 atm), in accordance with an embodiment of" should read -- oxygen=0.21 atm), in accordance with an embodiment of --

Column 4,
Line 25, that portion reading "the scintillator comprises $Lu_{0.8}Tb_{2.2}Al_5O_{12}$ activated with" should read -- the scintillator comprises $Lu_{0.8}Tb_{2.2}Al_5O_{12}$ activated with --

Column 7,
Line 32, that portion reading "$Tb_{2.2}Al_5O_{12}$ activated with $Ce^{3+}$ ions." should read -- $Tb_{2.2}Al_5O_{12}$ activated with $Ce^{3+}$ ions. --

Column 12,
Line 61, that portion reading "mm thick plate of $Lu_{0.8}Tb_{2.2}Al_5O_{12}$ is sufficiently high to" should read -- mm thick plate of $Lu_{0.8}Tb_{2.2}Al_5O_{12}$ is sufficiently high to --

Column 13,
Line 5, that portion reading "All experiments used scintillators of $Lu_{0.8}Tb_{2.2}Al_5O_{12}$" should read -- All experiments used scintillators of $Lu_{0.8}Tb_{2.2}Al_5O_{12}$ --
Line 59, that portion reading "pressure of oxygen=0.021 atm) (Sc-Air) and radiation dam-" should read -- pressure of oxygen=0.21 atm) (Sc-Air) and radiation dam- --

Column 14,
Line 4, that portion reading "pressure of oxygen=0.021 atm). It was found that for this" should read -- pressure of oxygen=0.21 atm). It was found that for this --
Line 11, that portion reading "$5x10^{-13}$" to 0.021 atm oxygen results in a significant change" should read -- $5x10^{-13}$ to 0.21 atm oxygen results in a significant change --
Line 25, that portion reading "methods of the resent invention provide significant improve-" should read - methods of the present invention provide significant improve- --

UNITED STATES PATENT AND TRADEMARK OFFICE
CERTIFICATE OF CORRECTION

PATENT NO. : 6,793,848 B2
DATED : September 21, 2004
INVENTOR(S) : James Scott Vartuli et al.

It is certified that error appears in the above-identified patent and that said Letters Patent is hereby corrected as shown below:

Column 15,
Line 17, that portion reading "said scintillator comprises the formula $(Th_{1-y}Ce_y)_aD_zO_{12};$" should read -- said scintillator comprises the formula $(Tb_{1-y}Ce_y)_aD_zO_{12};$ --
Lines 63 and 64, that portion reading "about 4 up to and including 5.1, and $0 \leq r \leq 0.5$ when $0<s \leq 0.5$ and $r+s \leq 1$, or $0 \leq r \leq 0.5$ when $0 \leq s \leq 0.5$ and $r+s \leq 1$." should read -- about 4 up to and including 5.1, and $0 \leq r \leq 0.5$ when $0<s \leq 0.5$ and $r+s <1$, or $0 < r \leq 0.5$ when $0 \leq s \leq 0.5$ and $r+s \leq 1$. --

Column 16,
Line 4, that portion reading "said garnet scintillator comprises $Lu_{0.8}Th_{2.2}Al_5O_{12}$ acti-" should read -- said garnet scintillator comprises $Lu_{0.8}Tb_{2.2}Al_5O_{12}$ acti- --

Column 17,
Line 6, that portion reading "pressure in the range from $1 \times 10^{-8}$ atm up to and including" should read -- pressure in the range from $1 \times 10^{-13}$ atm up to and including --

Column 18,
Line 20, that portion reading "$Ce_y)_3(Al_{1-R-s}Ga_rIn_s)_zO_{12}$ where y is in the range from about" should read -- $Ce_y)_3(Al_{1-r-s}Ga_rIn_s)_zO_{12}$ where y is in the range from about --

Column 19,
Line 1, that portion reading "sisting of terbium (Th) and lutetium (Lu), and is activated" should read -- sisting of terbium (Tb) and lutetium (Lu), and is activated --

This certificate supersedes Certificate of Correction issued April 5, 2005.

Signed and Sealed this

Ninth Day of August, 2005

JON W. DUDAS
*Director of the United States Patent and Trademark Office*